(12) United States Patent
Aoki

(10) Patent No.: US 12,212,122 B2
(45) Date of Patent: Jan. 28, 2025

(54) VERTICAL-CAVITY SURFACE-EMITTING LASER

(71) Applicant: Sumitomo Electric Industries, Ltd., Osaka (JP)

(72) Inventor: Takeshi Aoki, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 591 days.

(21) Appl. No.: 17/539,497

(22) Filed: Dec. 1, 2021

(65) Prior Publication Data

US 2022/0224079 A1   Jul. 14, 2022

(30) Foreign Application Priority Data

Jan. 12, 2021   (JP) ................................ 2021-002687

(51) Int. Cl.
  *H01S 5/00*     (2006.01)
  *H01S 5/024*    (2006.01)
  (Continued)

(52) U.S. Cl.
  CPC ...... *H01S 5/18361* (2013.01); *H01S 5/02461* (2013.01); *H01S 5/04257* (2019.08);
  (Continued)

(58) Field of Classification Search
  CPC ............ H01S 5/18361; H01S 5/02461; H01S 5/04257; H01S 5/18313; H01S 5/18327;
  (Continued)

(56) References Cited

U.S. PATENT DOCUMENTS

| 10,998,696 B2 * | 5/2021 | Kaneko ................. H01S 5/3432 |
| 2008/0056321 A1 * | 3/2008 | Motomura .......... H01S 5/18308 |
| | | 372/45.01 |

(Continued)

FOREIGN PATENT DOCUMENTS

| JP | 2008-060322 A | 3/2008 |
| JP | 2019-040953 A | 3/2019 |

OTHER PUBLICATIONS

M. Gbski, P.-S. Wong, M. Riaziat, and J. A. Lott, "30 GHz bandwidth temperature stable 980 nm vertical-cavity surface-emitting lasers with AlAs/GaAs bottom distributed Bragg reflectors for optical data communication", J. Phys. Photonics, vol. 2, No. 3, p. 035008, Jul. 2020, doi: 10.1088/2515-7647/ab9420.

*Primary Examiner* — Kinam Park
(74) *Attorney, Agent, or Firm* — Volpe Koenig

(57) ABSTRACT

A vertical-cavity surface-emitting laser includes a substrate having a main surface, a first lower distributed Bragg reflector that extends to an edge of the main surface, a III-V compound semiconductor layer disposed on the first lower distributed Bragg reflector, a second lower distributed Bragg reflector disposed on the III-V compound semiconductor layer, an active layer disposed above the second lower distributed Bragg reflector and an upper distributed Bragg reflector disposed on the active layer. The first lower distributed Bragg reflector includes a first layer and a second layer that are alternately arranged. The upper distributed Bragg reflector includes a third layer and a fourth layer that are alternately arranged. The III-V compound semiconductor layer is free of aluminum or has an aluminum composition less than an aluminum composition of the third layer. The first layer has an aluminum composition greater than the aluminum composition of the third layer.

14 Claims, 9 Drawing Sheets

(51) Int. Cl.
H01S 5/042 (2006.01)
H01S 5/183 (2006.01)
H01S 5/343 (2006.01)

(52) U.S. Cl.
CPC ...... H01S 5/18313 (2013.01); H01S 5/18327 (2013.01); H01S 5/18341 (2013.01); H01S 5/18347 (2013.01); H01S 5/34313 (2013.01)

(58) Field of Classification Search
CPC ............ H01S 5/18341; H01S 5/18347; H01S 5/34313
See application file for complete search history.

(56) References Cited

U.S. PATENT DOCUMENTS

| | | | | |
|---|---|---|---|---|
| 2010/0014551 | A1* | 1/2010 | Onishi | B82Y 20/00 |
| | | | | 372/50.124 |
| 2018/0287344 | A1* | 10/2018 | Tsuji | H01S 5/18344 |
| 2019/0067908 | A1* | 2/2019 | Onishi | H01S 5/02461 |
| 2021/0202777 | A1* | 7/2021 | Derkacs | B64U 50/31 |

* cited by examiner

Fig.5

| | MATERIALS | DOPANT CONCENTRATIONS ($cm^{-3}$) |
|---|---|---|
| CONTACT LAYER 29 | AlGaAs(Al=0.12) | CARBON $3\times10^{19}$ |
| UPPER DBR PORTION 22 | 23 PAIRS, AlGaAs(Al=0.12)/AlGaAs(Al=0.90) | CARBON $1\times10^{18}$/$8\times10^{18}$ |
| CURRENT APERTURE PORTION 26a | AlGaAs(Al=0.98) | CARBON $5.0\times10^{18}$ |
| ACTIVE LAYER 20 | UPPER SPACER 20b | AlGaAs(Al=0.3), 10 nm | UN-INTENTIONALLY DOPED |
| | QUANTUM WELL STRUCTURE 20a | 4 PAIRS, InGaAs 5nm/AlGaAs(Al=0.37) 5nm | UN-INTENTIONALLY DOPED |
| | LOWER SPACER 20c | AlGaAs(Al=0.3), 10 nm | UN-INTENTIONALLY DOPED |
| THIRD LOWER DBR PORTION 24 | 8 PAIRS, AlGaAs(Al=0.12)/AlGaAs(Al=0.90) | SILICON $2\times10^{18}$/$1\times10^{18}$ |
| CONTACT LAYER 28 | AlGaAs(Al=0.12) | SILICON $5\times10^{18}$ |
| SECOND LOWER DBR PORTION 18 | 8 PAIRS, AlGaAs(Al=0.12)/AlGaAs(Al=0.90) | SILICON $2\times10^{18}$/$1\times10^{18}$ |
| CAP LAYER 16 | AlGaAs(Al=0.12), 240nm | UN-INTENTIONALLY DOPED |
| FIRST LOWER DBR PORTION 14 | 25 PAIRS, GaAs/AlAs | UN-INTENTIONALLY DOPED |
| SUBSTRATE 12 | SEMI-INSULATING GaAs SUBSTRATE | UN-INTENTIONALLY DOPED |

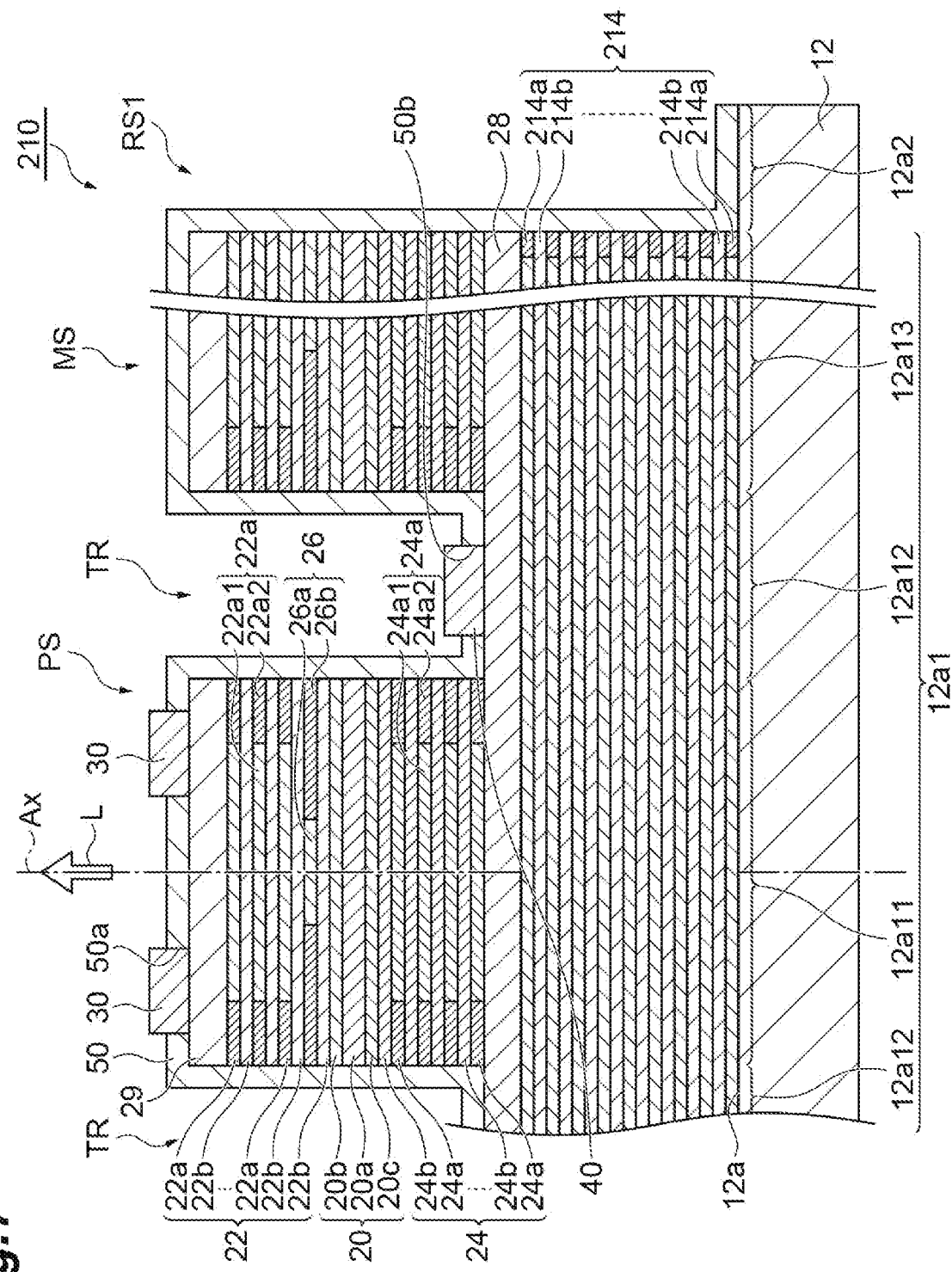

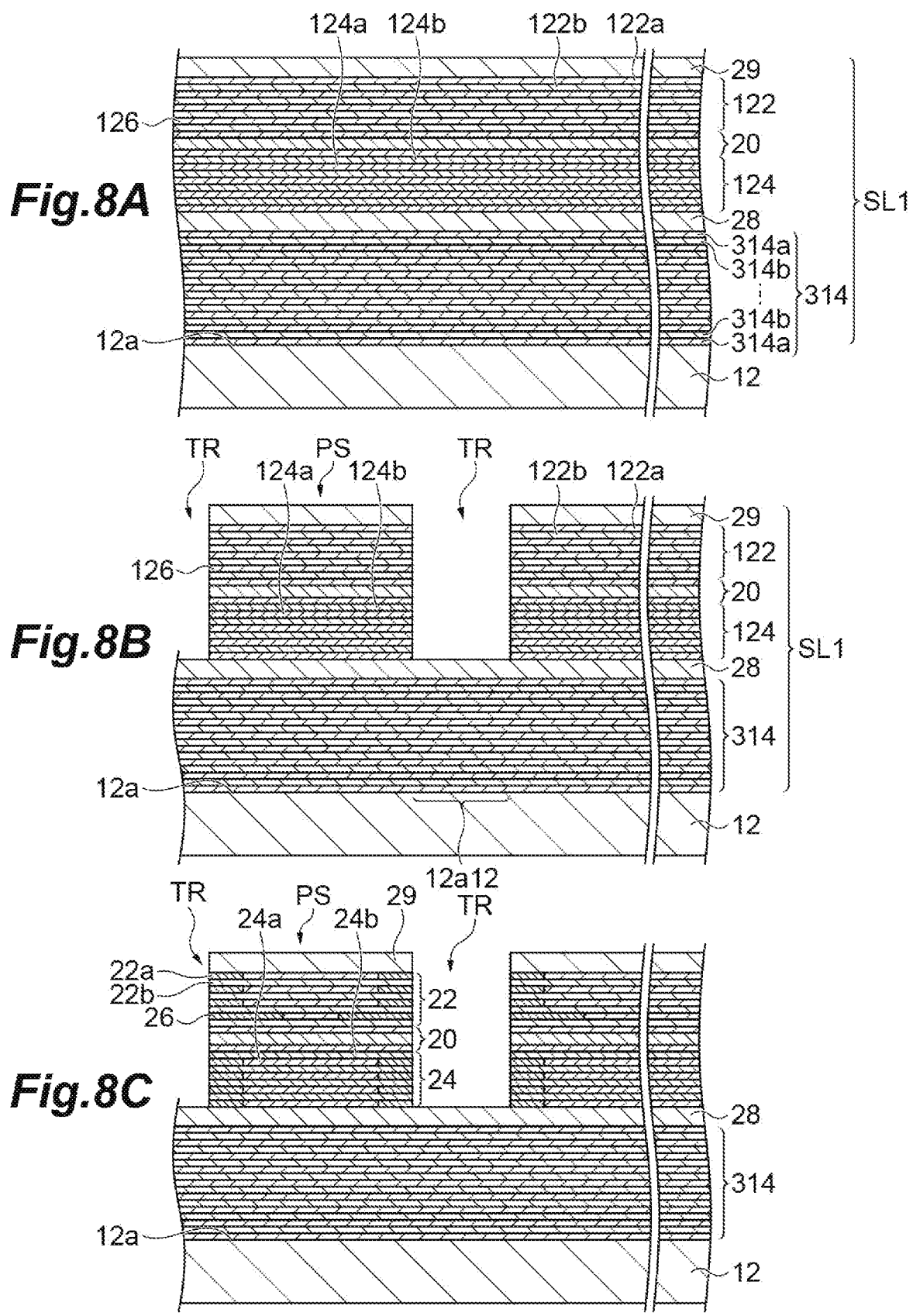

VERTICAL-CAVITY SURFACE-EMITTING LASER

CROSS REFERENCE TO RELATED APPLICATIONS

This application claims priority based on Japanese Patent Application No. 2021-002687, filed on Jan. 12, 2021, and the entire contents of the Japanese patent application are incorporated herein by reference.

TECHNICAL FIELD

The present disclosure relates to a vertical-cavity surface-emitting laser.

BACKGROUND

Non-Patent Document 1 (M. Gbski, P.-S. Wong, M. Riaziat, and J. A. Lott, "30 GHz bandwidth temperature stable 980 nm vertical-cavity surface-emitting lasers with AlAs/GaAs bottom distributed Bragg reflectors for optical data communication", J. Phys. Photonics, vol. 2, no. 3, p. 035008, July 2020, doi: 10.1088/2515-7647/ab9420) discloses a vertical-cavity surface-emitting laser that is provided with a bottom distributed Bragg reflector including an AlAs layer and a GaAs layer that are alternately arranged on a GaAs substrate.

SUMMARY

A vertical-cavity surface-emitting laser according to an aspect of the present disclosure includes a substrate having a main surface including a first area and a second area that surrounds the first area; a first lower distributed Bragg reflector disposed on the first area and the second area, the first lower distributed Bragg reflector extending to an edge of the main surface; a III-V compound semiconductor layer disposed on the first lower distributed Bragg reflector; a second lower distributed Bragg reflector disposed on the III-V compound semiconductor layer; an active layer disposed above the second lower distributed Bragg reflector; and an upper distributed Bragg reflector disposed on the active layer. The III-V compound semiconductor layer is disposed above the first area and the second area. The second lower distributed Bragg reflector is disposed above the first area. The first lower distributed Bragg reflector includes a first layer and a second layer that are alternately arranged. The first layer has a refractive index lower than a refractive index of the second layer and includes a III-V compound semiconductor including aluminum. The upper distributed Bragg reflector includes a third layer and a fourth layer that are alternately arranged. The third layer has a refractive index lower than a refractive index of the fourth layer and includes a III-V compound semiconductor including aluminum. The III-V compound semiconductor layer is free of aluminum or has an aluminum composition less than an aluminum composition of the third layer. The first layer has an aluminum composition greater than the aluminum composition of the third layer. The III-V compound semiconductor layer has a thickness greater than a thickness of the second layer.

BRIEF DESCRIPTION OF THE DRAWINGS

The foregoing and other purposes, aspects and advantages will be better understood from the following detailed description of a preferred embodiment of the invention with reference to the drawings.

FIG. 5 is a view illustrating materials and dopant concentrations of components of a vertical-cavity surface-emitting laser according to an Example 1.

FIG. 7 is a plan view schematically illustrating an example of a vertical-cavity surface-emitting laser.

FIGS. 8A to 8C are cross-sectional views schematically illustrating steps of a method for manufacturing the vertical-cavity surface-emitting laser illustrated in FIG. 7.

DETAILED DESCRIPTION

Figure 1:
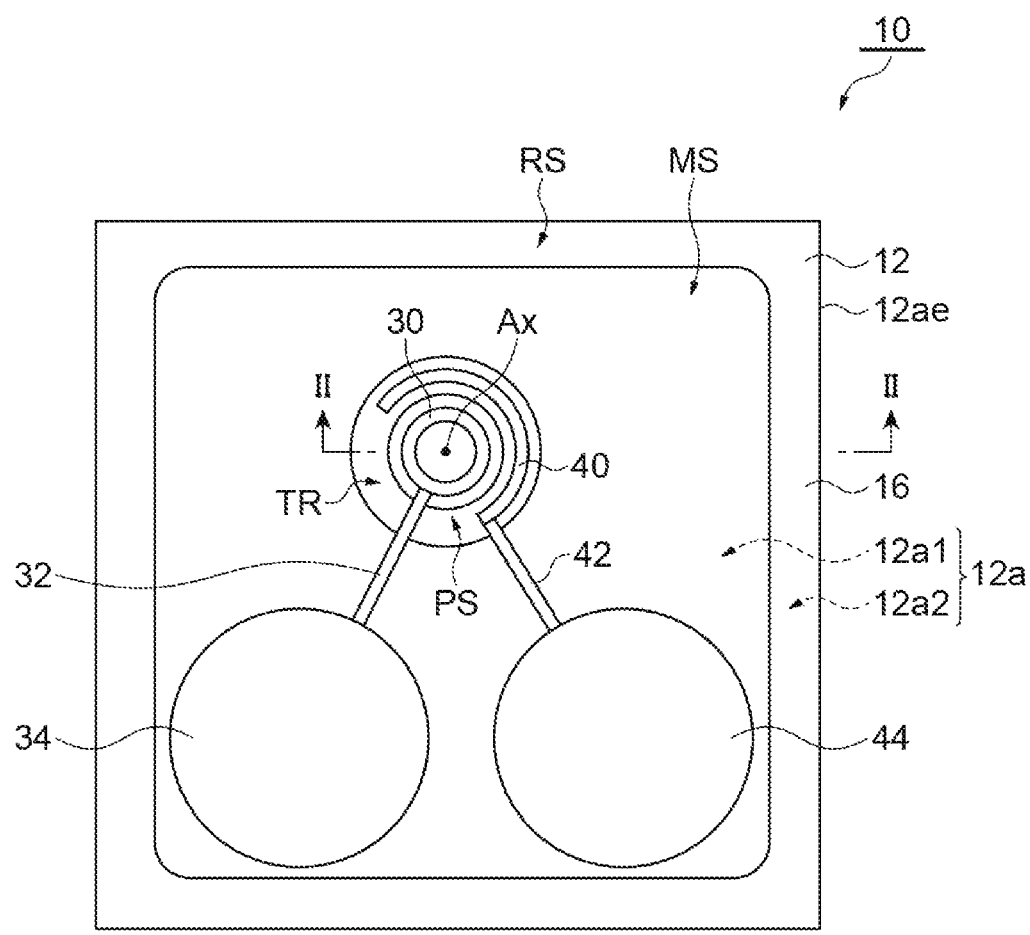
FIG. 1 is a plan view schematically illustrating a vertical-cavity surface-emitting laser according to an embodiment.

AlAs layer is susceptible to oxidation due to a large aluminum composition. In the above conventional vertical-cavity surface-emitting laser, since the side face of the AlAs layer is exposed during manufacturing, the AlAs layer may be naturally oxidized near the side face.

The present disclosure provides a vertical-cavity surface-emitting laser in which a layer having a relatively large aluminum composition is less likely to be oxidized.

DESCRIPTION OF EMBODIMENTS OF THE PRESENT DISCLOSURE

A vertical-cavity surface-emitting laser according to an aspect of the present disclosure includes a substrate having a main surface including a first area and a second area that surrounds the first area; a first lower distributed Bragg reflector disposed on the first area and the second area, the first lower distributed Bragg reflector extending to an edge of the main surface; a III-V compound semiconductor layer disposed on the first lower distributed Bragg reflector; a second lower distributed Bragg reflector disposed on the III-V compound semiconductor layer; an active layer disposed above the second lower distributed Bragg reflector; and an upper distributed Bragg reflector disposed on the active layer. The III-V compound semiconductor layer is disposed above the first area and the second area. The second lower distributed Bragg reflector is disposed above the first area. The first lower distributed Bragg reflector includes a first layer and a second layer that are alternately arranged. The first layer has a refractive index lower than a refractive index of the second layer and includes a III-V compound semiconductor including aluminum. The upper distributed Bragg reflector includes a third layer and a fourth layer that are alternately arranged. The third layer has a refractive index lower than a refractive index of the fourth layer and includes a III-V compound semiconductor including aluminum. The III-V compound semiconductor layer is free of aluminum or has an aluminum composition less than an aluminum composition of the third layer. The first layer has an aluminum composition greater than the aluminum composition of the third layer. The III-V compound semiconductor layer has a thickness greater than a thickness of the second layer.

According to the vertical-cavity surface-emitting laser, the first lower distributed Bragg reflector extends to an edge of the main surface of the substrate. The III-V compound semiconductor layer is disposed on the first lower distributed Bragg reflector. Therefore, even when the first layer having a relatively large aluminum composition is included in the first lower distributed Bragg reflector, the first layer is hardly oxidized.

The upper distributed Bragg reflector may include a current confinement structure. The current confinement structure may include a current aperture portion and an insulator portion. The current aperture portion may include a III-V compound semiconductor including aluminum. The insulator portion may surround the current aperture portion. The first layer may have an aluminum composition greater than or equal to an aluminum composition of the current aperture portion. In this case, the aluminum composition of the first layer increases. Even in such a case, in the vertical-cavity surface-emitting laser, the first layer is hardly oxidized.

The second layer may be free of aluminum or may have an aluminum composition less than the aluminum composition of the III-V compound semiconductor layer. In this case, the aluminum composition of the second layer becomes small.

The first layer may include AlAs, and the second layer may include GaAs. In this case, the thermal resistance of the vertical-cavity surface-emitting laser can be reduced as compared with the case where each of the first layer and the second layer includes a ternary III-V compound semiconductor.

In a case where T is a thickness of the III-V compound semiconductor layer, N is a refractive index of the III-V compound semiconductor layer, λ is an oscillation wavelength of the vertical-cavity surface-emitting laser, and m is an integer greater than or equal to 1, a formula of $T=(m \times \lambda/2+\lambda/4)/N$ may be satisfied. In this case, a reduction in periodicity in the first lower distributed Bragg reflector and the second lower distributed Bragg reflector can be suppressed. The confinement of light in the III-V compound semiconductor layer can be suppressed due to λ/4 in the above formula.

The second lower distributed Bragg reflector may include a fifth layer and a sixth layer that are alternately arranged. The fifth layer may have a refractive index lower than a refractive index of the sixth layer. The number of pairs of the fifth layer and the sixth layer is 8 or more and 25 or less. In this case, the first lower distributed Bragg reflector can be separated from the active layer by an appropriate distance.

The vertical-cavity surface-emitting laser may further include a third lower distributed Bragg reflector disposed between the active layer and the second lower distributed Bragg reflector and a contact layer disposed between the second lower distributed Bragg reflector and the third lower distributed Bragg reflector. In this case, a current may be injected into the active layer through the contact layer and the third lower distributed Bragg reflector.

DETAILS OF EMBODIMENTS OF THE PRESENT DISCLOSURE

Hereinafter, embodiments of the present disclosure will be described in detail with reference to the drawings. In the description of the drawings, like or corresponding elements are denoted by like reference numerals and redundant descriptions thereof will be omitted.

Figure 2:
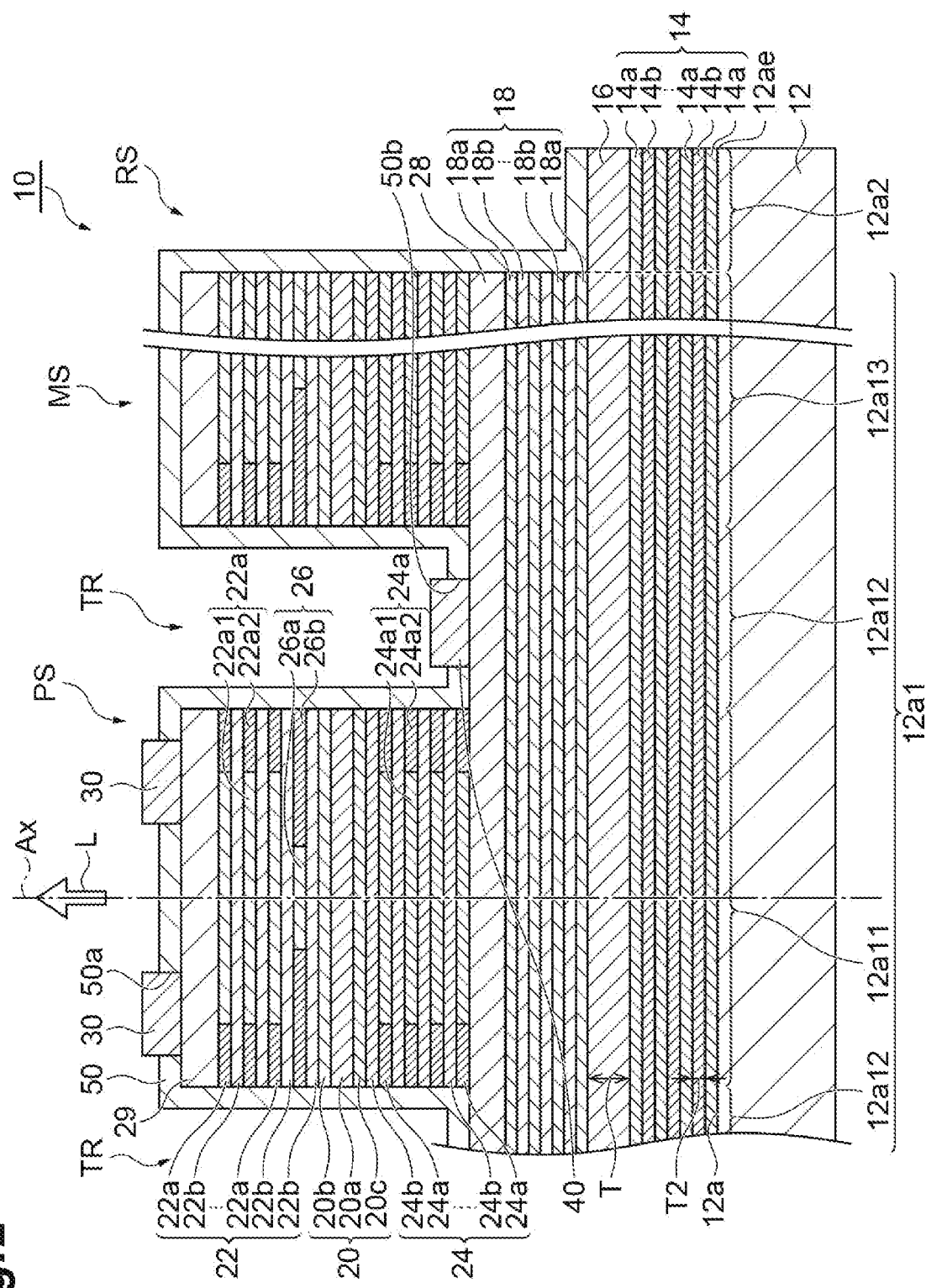
FIG. 2 is a cross-sectional view taken along line II-II in FIG. 1.

FIG. 1 is a plan view schematically illustrating a vertical-cavity surface-emitting laser according to an embodiment. FIG. 2 is a cross-sectional view taken along line II-II in FIG. 1. A vertical-cavity surface-emitting laser (VCSEL) 10 illustrated in FIGS. 1 and 2 is, for example, a laser for communication. Vertical-cavity surface-emitting laser 10 emits a laser light L in a direction along an axis Ax. An oscillation wavelength of laser light L is, for example, greater than or equal to 840 nm and smaller than or equal to 860 nm. As illustrated in FIG. 2, vertical-cavity surface-emitting laser 10 includes a substrate 12, a first lower distributed Bragg reflector portion (first lower DBR) 14, a cap layer (III-V compound semiconductor layer) 16, a second lower distributed Bragg reflector portion (second lower DBR) 18, an active layer 20, and an upper distributed Bragg reflector portion (upper DBR) 22. Vertical-cavity surface-emitting laser 10 may further include a third lower DBR portion (third lower DBR) 24, a contact layer 28, and a contact layer 29.

Substrate 12 may be a semi-insulating substrate. Substrate 12 has a main surface 12a that intersects axis Ax. Main surface 12a includes a first area 12a1 and a second area 12a2 which surrounds first area 12a1. Second area 12a2 is located along an edge 12ae of main surface 12a. Second area 12a2 may be an annular area extending along edge 12ae of main surface 12a. A carrier concentration of substrate 12 is, for example, $1\times10^{15}$ cm$^{-3}$ or less. Substrate 12 may be a III-V compound semiconductor substrate such as GaAs.

First lower DBR portion 14 is disposed on first area 12a1 and second area 12a2. First lower DBR portion 14 extends to edge 12ae of main surface 12a of substrate 12. First lower DBR portion 14 may cover the entire main surface 12a of substrate 12. First lower DBR portion 14 includes a first layer 14a and a second layer 14b that are alternately arranged in a direction along axis Ax. The number of pairs of first layer 14a and second layer 14b may be 20 or more and 40 or less. First layer 14a has a refractive index lower than the refractive index of second layer 14b. First layer 14a includes a III-V compound semiconductor including aluminum. First layer 14a has an aluminum composition x. First layer 14a may include AlAs or $Al_xGa_{1-x}As$. An aluminum composition x may be greater than 0.9, may be 0.98 or greater, or may be 1. As the aluminum composition x increases, the refractive index decreases. In one embodiment, first layer 14a is an AlAs layer. Second layer 14b includes a III-V compound semiconductor. Second layer 14b may be free of aluminum, or may have a small aluminum composition. Second layer 14b may include GaAs or $Al_{x1}Ga_{1-x1}As$. An aluminum composition x1 may be smaller than x, may be 0.3 or smaller, or may be zero. In one embodiment, second layer 14b is a GaAs layer. First lower DBR portion 14 may be undoped or may be of a first conductivity type (e.g., p-type). Examples of p-type dopants include carbon. The undoped first lower DBR portion 14 includes an un-intentionally doped first lower DBR portion 14. A thickness of first layer 14a may be greater than or equal to 50 nm and smaller than or equal to 100 nm. A thickness T1 of second layer 14b may be greater than or equal to 50 nm and smaller than or equal to 100 nm.

Cap layer 16 is disposed on first lower DBR portion 14. Cap layer 16 is disposed above first area 12a1 and second area 12a2. Cap layer 16 may extend to edge 12ae of main surface 12a of substrate 12 in a direction along main surface 12a. Cap layer 16 may cover the entire top face of first lower DBR portion 14. Cap layer 16 includes a III-V compound semiconductor. Cap layer 16 is free of aluminum or has a small aluminum composition y. Cap layer 16 may include $Al_yGa_{1-y}As$ or GaAs. An aluminum composition y may be smaller than or equal to 0.3, smaller than or equal to 0.2, or equal to zero. In one embodiment, cap layer 16 is an $Al_yGa_{1-y}As$ (y=0.12) layer. Cap layer 16 may be undoped or may be of a second conductivity type (e.g., n-type) opposite to the first conductivity type. Examples of n-type dopants include silicon. The undoped cap layer 16 includes an un-intentionally doped cap layer 16.

Thickness T of cap layer 16 is greater than the thickness T1 of second layer 14b. Cap layer 16 may be greater than the thickness of first layer 14a. Thickness T may be greater than or equal to 100 nm, or may be greater than or equal to 200 nm. Thickness T may be smaller than or equal to 400 nm. In one embodiment, thickness T is 240 nm. In a case where T is a thickness of cap layer 16, N is a refractive index of cap layer 16, λ is an oscillation wavelength of vertical-cavity surface-emitting laser 10, and m is an integer greater than or equal to 1, the following formula (1) may be satisfied.

$$T=(m\times\lambda/2+\lambda/4)/N \quad (1)$$

For example, when λ is 853.7 nm, a refractive index of GaAs is 3.663, a refractive index of $Al_yGa_{1-y}As$ (y=0.12) is 3.522, and a refractive index of $Al_yGa_{1-y}As$ (y=0.2) is 3.452. As the aluminum composition y increases, the refractive index of $Al_yGa_{1-y}As$ monotonically decreases.

Second lower DBR portion 18 is disposed on cap layer 16. Second lower DBR portion 18 is disposed above first area 12a1 and is not disposed above second area 12a2. Second lower DBR portion 18 includes a fifth layer 18a and a sixth layer 18b that are alternately arranged in a direction along axis Ax. The number of pairs of fifth layer 18a and sixth layer 18b may be 8 or more and 25 or less. A thickness of second lower DBR portion 18 may be greater than or equal to 0.5 μm. Fifth layer 18a has a refractive index lower than the refractive index of sixth layer 18b. Each of fifth layer 18a and sixth layer 18b includes a III-V compound semiconductor including aluminum. Fifth layer 18a has an aluminum composition greater than the aluminum composition of sixth layer 18b. Each of fifth layer 18a and sixth layer 18b may include AlGaAs. Second lower DBR portion 18 may be of a second conductivity type (e.g., n-type).

Active layer 20 is disposed above second lower DBR portion 18. Active layer 20 includes a quantum well structure 20a, an upper spacer 20b, and a lower spacer 20c. Lower spacer 20c is disposed above second lower DBR portion 18. Quantum well structure 20a is disposed on lower spacer 20c. Upper spacer 20b is disposed on quantum well structure 20a. Quantum well structure 20a may include an InGaAs layer and an AlGaAs layer that are alternately arranged in a direction along axis Ax. Each of upper spacer 20b and lower spacer 20c may be an AlGaAs layer.

Upper DBR portion 22 is disposed on active layer 20. Upper DBR portion 22 includes a third layer 22a and a fourth layer 22b that are alternately arranged in a direction along axis Ax. The number of pairs of third layer 22a and fourth layer 22b may be 20 or more and 30 or less. Third layer 22a has a refractive index lower than the refractive index of fourth layer 22b. Each of third layer 22a and fourth layer 22b includes a III-V compound semiconductor including aluminum. Third layer 22a has an aluminum composition z greater than the aluminum composition of fourth layer 22b. Third layer 22a may include $Al_zGa_{1-z}As$. An aluminum composition z may be greater than or equal to 0.7, or may be greater than or equal to 0.9. In one embodiment, an aluminum composition z is 0.9. The aluminum composition x of first layer 14a of first lower DBR portion 14 is greater than the aluminum composition z of third layer 22a. The aluminum composition y of cap layer 16 is smaller than the aluminum composition z of the 22a of third layer. Fourth layer 22b may include $Al_{z1}Ga_{1-z1}As$. An aluminum composition z1 may be smaller than or equal to 0.3. Upper DBR portion 22 may be of a first conductivity type (e.g., p-type).

Upper DBR portion 22 may include a current confinement structure 26. Current confinement structure 26 includes a current aperture portion 26a including a III-V compound semiconductor including aluminum and an insulator portion 26b. Insulator portion 26b surrounds current aperture portion 26a. Axis Ax passes through current aperture portion 26a. Current aperture portion 26a has, for example, a cylindrical shape. Current aperture portion 26a has an aluminum composition s. Current aperture portion 26a may include $Al_sGa_{1-s}As$. An aluminum composition s may be greater than or equal to 0.95, or may be greater than or equal to 0.98. In one embodiment, an aluminum composition s is 0.98. The aluminum composition x of first layer 14a of first lower DBR portion 14 may be greater than or equal to the aluminum composition s of current aperture portion 26a. Current aperture portion 26a may be of a first conductivity type (e.g., p-type). Insulator portion 26b may include aluminum oxides.

Third lower DBR portion 24 is disposed between active layer 20 and second lower DBR portion 18. Third lower DBR portion 24 includes a seventh layer 24a and an eighth layer 24b that are alternately arranged in a direction along axis Ax. The number of pairs of seventh layer 24a and eighth layer 24b may be 8 or more and 25 or less. Seventh layer 24a has a lower refractive index than the refractive index of eighth layer 24b. Each of seventh layer 24a and eighth layer 24b includes a III-V compound semiconductor including aluminum. Seventh layer 24a has an aluminum composition greater than the aluminum composition of eighth layer 24b. Each of seventh layer 24a and eighth layer 24b may include AlGaAs. Third lower DBR portion 24 may be of a second conductivity type (e.g., n-type).

Contact layer 28 is disposed between second lower DBR portion 18 and third lower DBR portion 24. Contact layer 28 may be of a second conductivity type (e.g., n-type). Contact layer 28 includes, for example, a III-V compound semiconductor such as AlGaAs. A dopant concentration of contact layer 28 is higher than the dopant concentration of second lower DBR portion 18. The dopant concentration of second lower DBR portion 18 is higher than the dopant concentration of cap layer 16.

Contact layer 29 is disposed on upper DBR portion 22. Contact layer 29 may be of a first conductivity type (for example, p-type). Contact layer 29 includes, for example, a III-V compound semiconductor such as AlGaAs. A dopant concentration of contact layer 29 is higher than the dopant concentration of upper DBR portion 22.

First area 12a1 of main surface 12a of substrate 12 may include a first region 12a11, an annular second region 12a12 surrounding first region 12a11, and a third region 12a13 surrounding second region 12a12. Axis Ax passes through first region 12a11. First region 12a11 has, for example, a circular shape centered on axis Ax. A post PS including third lower DBR portion 24, active layer 20, upper DBR portion 22, and contact layer 29 is disposed above first region 12a11. A trench TR surrounding post PS is disposed above second region 12a12. The bottom of trench TR reaches contact layer 28. A mesa MS having the same layer structure as post PS is disposed above third region 12a13. A recessed portion RS is disposed above second area 12a2 of main surface 12a.

Recessed portion RS is a cutout portion. The bottom of recessed portion RS reaches cap layer 16.

An insulating layer 50 is disposed on post PS, trench TR, mesa MS, and recessed portion RS. Insulating layer 50 is used as a protective film. Insulating layer 50 has a first opening 50a disposed above the top face of post PS and a second opening 50b disposed above the bottom of trench TR. A first electrode 30 connected to contact layer 29 is disposed in first opening 50a. First electrode 30 may be an annular-shaped electrode surrounding axis Ax. First electrode 30 is, for example, an anode electrode. First electrode 30 is connected to a pad electrode 34 by a wiring conductor 32. A second electrode 40 connected to contact layer 28 is disposed in second opening 50b. Second electrode 40 is, for example, a cathode electrode. Second electrode 40 is connected to a pad electrode 44 by a wiring conductor 42.

According to vertical-cavity surface-emitting laser 10 of the present embodiment, first lower DBR portion 14 extends to edge 12ae of main surface 12a of substrate 12, and cap layer 16 is disposed on first lower DBR portion 14. Therefore, even when first layer 14a having a relatively large aluminum composition is included in first lower DBR portion 14, first layer 14a is hardly oxidized. Even when a barrier property of insulating layer 50 is low, since first lower DBR portion 14 is covered with cap layer 16, first layer 14a is hardly oxidized. Therefore, it is possible to suppress a strain caused by a difference in density or a difference in thermal expansion coefficient between a portion including the III-V compound semiconductor and a portion including oxides. Accordingly, vertical-cavity surface-emitting laser 10 has high reliability even after long-term use.

When first layer 14a has an aluminum composition x greater than or equal to the aluminum composition s of current aperture portion 26a, the aluminum composition x of first layer 14a increases. Even in such a case, according to vertical-cavity surface-emitting laser 10, first layer 14a is hardly oxidized.

In the case where first layer 14a includes AlAs and second layer 14b includes GaAs, the thermal resistance of vertical-cavity surface-emitting laser 10 can be reduced as compared with the case where first layer 14a and second layer 14b each include a ternary III-V compound semiconductor. Thus, even when a current injected into vertical-cavity surface-emitting laser 10 is increased, an increase in self-heating can be suppressed. Therefore, it is possible to widen a modulation band of vertical-cavity surface-emitting laser 10 while maintaining a desired optical output of vertical-cavity surface-emitting laser 10.

When the above formula (1) is satisfied, it is possible to suppress a decrease in periodicity in first lower DBR portion 14 and second lower DBR portion 18. Furthermore, since a parasitic cavity is hardly formed due to $\lambda/4$ in the above formula (1), confinement of light in cap layer 16 can be suppressed.

When the number of pairs of fifth layer 18a and sixth layer 18b is 8 or more and 25 or less, first lower DBR portion 14 can be separated from active layer 20 by an appropriate distance. Therefore, light absorption by first lower DBR portion 14 can be suppressed.

FIGS. 3A to 4C are cross-sectional views schematically illustrating steps of a method for manufacturing a vertical-cavity surface-emitting laser according to an embodiment. The above-described vertical-cavity surface-emitting laser 10 may be manufactured as follows.

(Formation of Semiconductor Laminate)

Figure 3A:
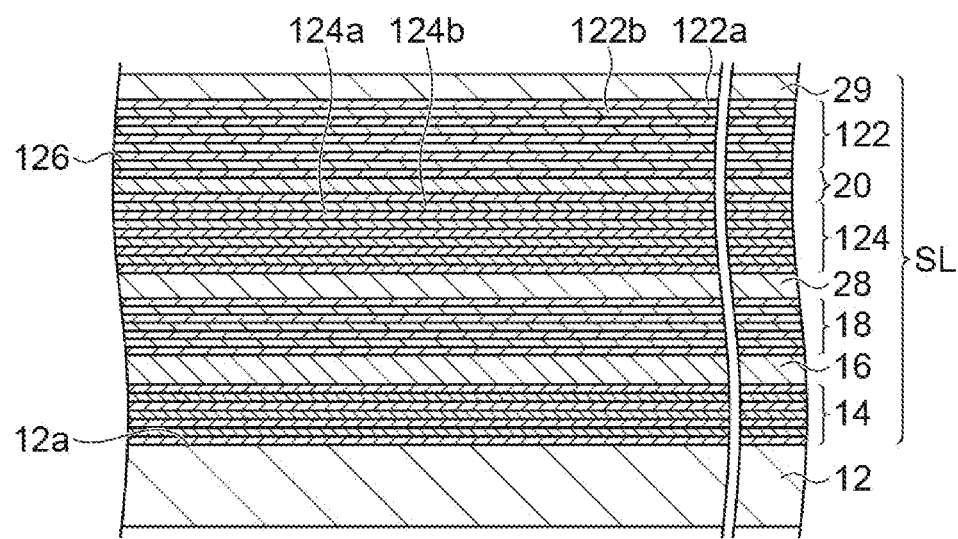
FIGS. 3A to 3C are cross-sectional views schematically illustrating steps of a method for manufacturing a vertical-cavity surface-emitting laser according to an embodiment.

First, as illustrated in FIG. 3A, a semiconductor laminate SL is formed on main surface 12a of substrate 12. Specifically, first lower DBR portion 14, cap layer 16, second lower DBR portion 18, contact layer 28, a semiconductor laminate 124 to be third lower DBR portion 24, active layer 20, a semiconductor laminate 122 to be upper DBR portion 22, and contact layer 29 are formed in this order on main surface 12a. Semiconductor laminate 122 includes a semiconductor layer 122a and a semiconductor layer 122b that are to be third layer 22a and fourth layer 22b, respectively, and a semiconductor layer 126 that is to be current confinement structure 26. Semiconductor laminate 124 includes a semiconductor layer 124a and a semiconductor layer 124b that are to be seventh layer 24a and eighth layer 24b, respectively. Each layer included in semiconductor laminate SL is formed by, for example, organometallic vapor phase growth or molecular beam epitaxy.

(Formation of Trench)

Figure 3B:
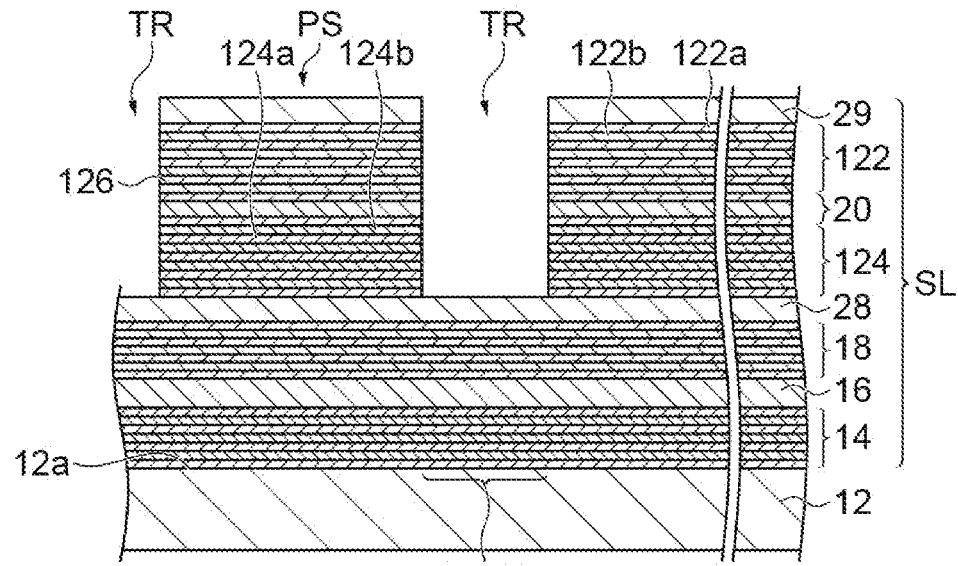

Next, as illustrated in FIG. 3B, trench TR is formed in semiconductor laminate SL above second region 12a12 in first area 12a1 of main surface 12a. Thus, post PS surrounded by trench TR is formed. Trench TR is formed by, for example, dry etching.

(Oxidation)

Figure 3C:
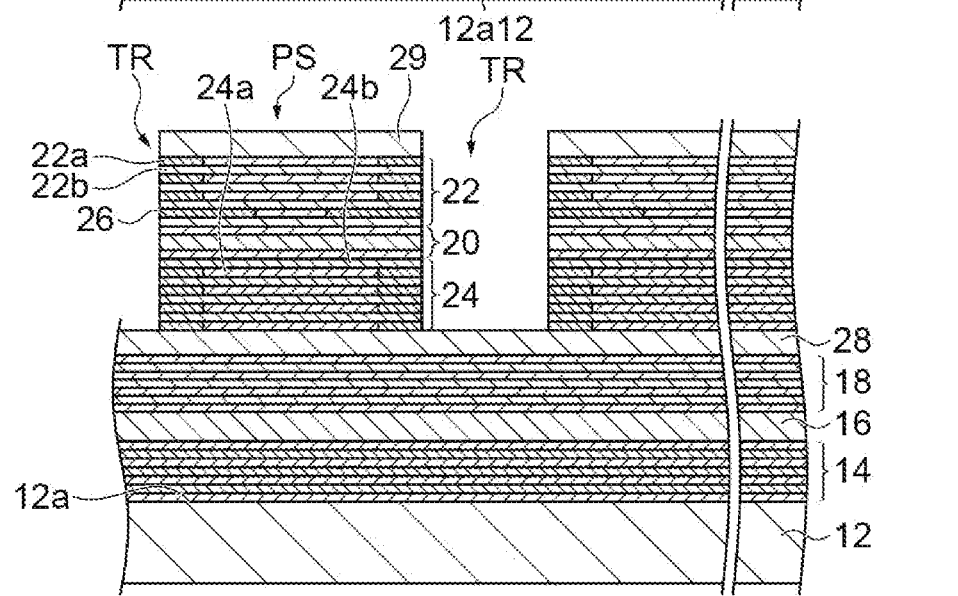

Next, as illustrated in FIG. 3C, post PS is exposed to an oxygen-containing gas such as water vapor to oxidize the outer periphery of post PS. Thus, upper DBR portion 22 and third lower DBR portion 24 are formed.

(Formation of Recessed Portion)

Figure 4A:
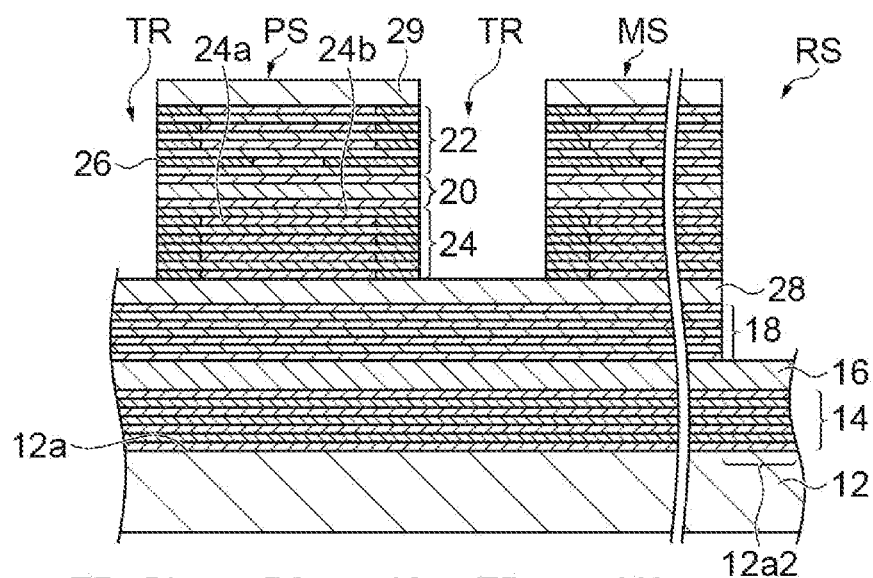
FIGS. 4A to 4C are cross-sectional views schematically illustrating steps of a method for manufacturing a vertical-cavity surface-emitting laser according to an embodiment.

Next, as illustrated in FIG. 4A, recessed portion RS is formed above second area 12a2 of main surface 12a. As a result, mesa MS is formed between recessed portion RS and trench TR. Recessed portion RS is formed by, for example, dry etching. Recessed portion RS is formed to electrically isolate adjacent elements from each other. Recessed portion RS may be a grid-like groove that extends along main surface 12a. After recessed portion RS is formed, a portion of fifth layer 18a of second lower DBR portion 18 that is exposed to the side wall of recessed portion RS may be naturally oxidized. On the other hand, first layer 14a of first lower DBR portion 14 is covered with cap layer 16, so that first layer 14a is not naturally oxidized.

(Formation of Insulating Layer)

Figure 4B:
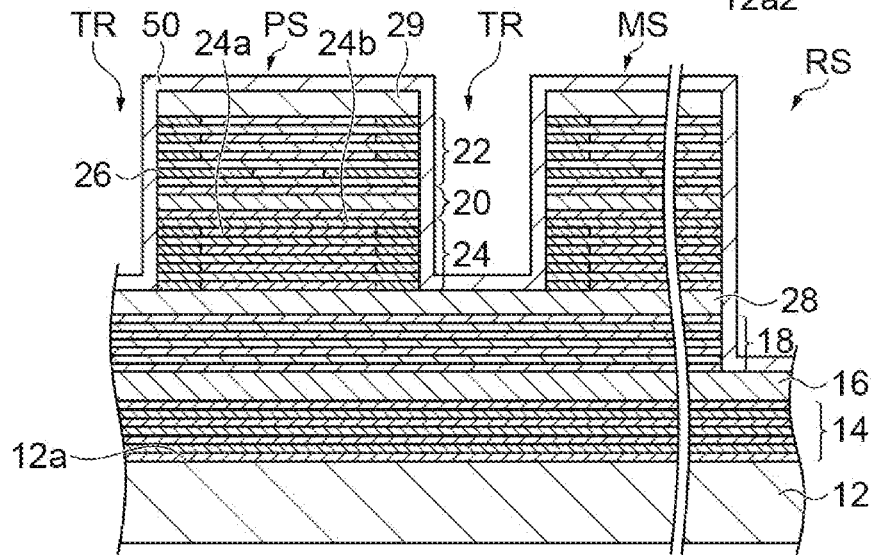

Next, as illustrated in FIG. 4B, insulating layer 50 is formed on post PS, trench TR, mesa MS, and recessed portion RS.

(Formation of Electrode)

Figure 4C:
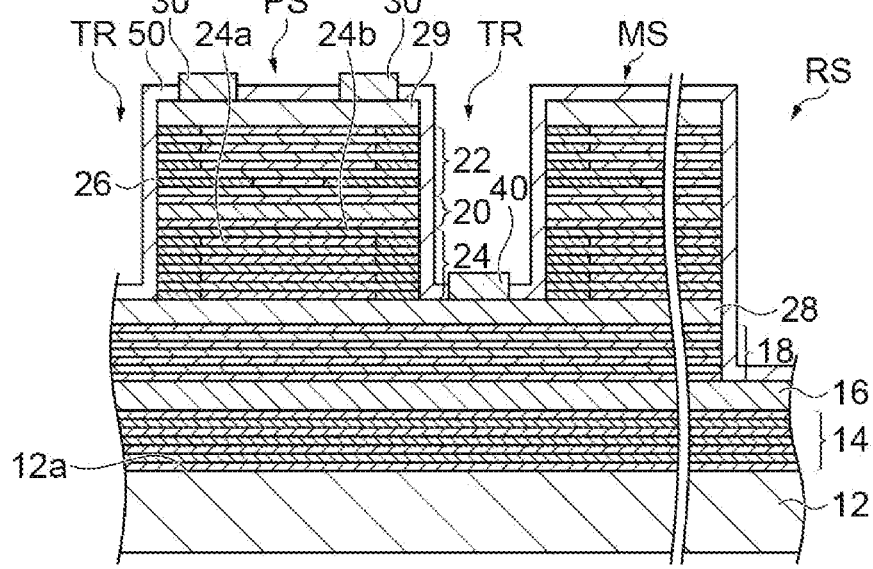

Next, as illustrated in FIG. 4C, first opening 50a and second opening 50b are formed in insulating layer 50. Thereafter, first electrode 30 is formed in first opening 50a, and second electrode 40 is formed in second opening 50b.

(Cutting)

Next, substrate 12, first lower DBR portion 14, and cap layer 16 are cut at the bottom of recessed portion RS. The cutting is performed by, for example, cleavage or dicing. In this way, vertical-cavity surface-emitting laser 10 illustrated in FIGS. 1 and 2 is manufactured.

FIG. 5 is a view illustrating materials and dopant concentrations of components of a vertical-cavity surface-emitting laser according to an Example 1. A vertical-cavity surface-emitting laser according to Example 1 is an example of vertical-cavity surface-emitting laser 10 in FIG. 2. An oscillation wavelength of the vertical-cavity surface-emitting laser of Example 1 is 850 nm.

A vertical-cavity surface-emitting laser according to Example 2 has the same configuration as the vertical-cavity surface-emitting laser according to Example 1 except that first lower DBR portion 14 is formed of 25 pairs of $Al_{0.12}Ga_{0.88}As/Al_{0.9}Ga_{0.1}As$ instead of 25 pairs of GaAs/AlAs.

Characteristics of vertical-cavity surface-emitting lasers of Examples 1 and 2 were simulated. The simulation results are illustrated below. A threshold current $I_{th}$ of the vertical-cavity surface-emitting laser of Example 1 was 0.70 mA. A threshold current $I_{th}$ of the vertical-cavity surface-emitting laser of Example 2 was 0.71 mA. A slope efficiency of the vertical-cavity surface-emitting laser of Example 1 was 0.72 W/A. A slope efficiency of the vertical-cavity surface-emitting laser of Example 2 was 0.73 W/A. A thermal resistance $R_{th}$ of the vertical-cavity surface-emitting laser of Example 1 was 2.08 K/mW. A thermal resistance $R_{th}$ of the vertical-cavity surface-emitting laser of Example 2 was 2.38 K/mW. The vertical-cavity surface-emitting laser of Example 1 had a threshold current $I_{th}$ and a slope efficiency equivalent to those of the vertical-cavity surface-emitting laser of Example 2, and had a thermal resistance $R_{th}$ about 20% smaller than that of the vertical-cavity surface-emitting laser of Example 2.

Figure 6:
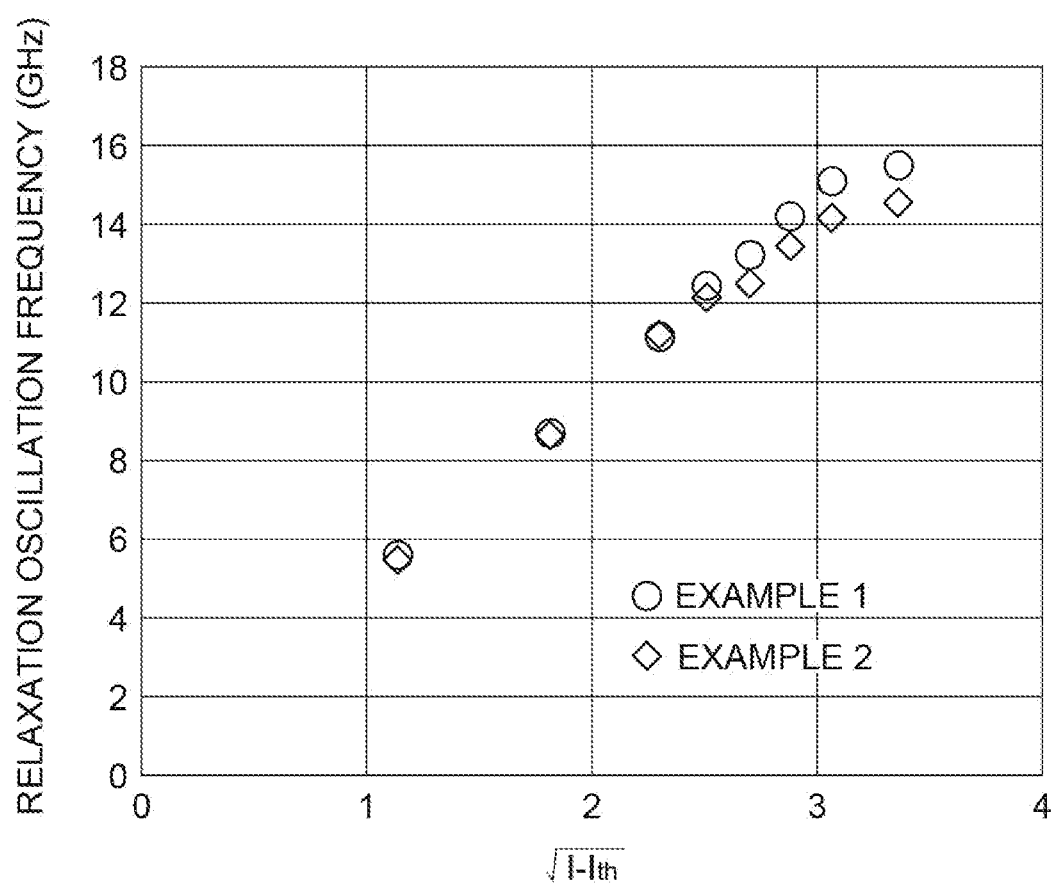
FIG. 6 is a graph illustrating simulation results of characteristics of vertical-cavity surface-emitting lasers according to an Example 1 and an Example 2.

FIG. 6 is a graph illustrating simulation results of characteristics of vertical-cavity surface-emitting lasers according to Example 1 and Example 2. A horizontal axis represents a square root of a value obtained by subtracting a threshold current $I_{th}$ (mA) from a current I (mA) injected into each vertical-cavity surface-emitting laser. A vertical axis represents a relaxation oscillation frequency $f_r$ (GHz). The relaxation oscillation frequency $f_r$ is a measure for a performance of the modulation band of optical response.

It can be seen from FIG. 6 that, when a current I is relatively large, the vertical-cavity surface-emitting laser of Example 1 has a relaxation oscillation frequency $f_r$ that is, for example, about 1 GHz larger than that of the vertical-cavity surface-emitting laser of Example 2. In the vertical-cavity surface-emitting laser of Example 1, since the thermal resistance is reduced as compared with the vertical-cavity surface-emitting laser of Example 2, the modulation band can be expanded.

FIG. 7 is a plan view schematically illustrating an example of a vertical-cavity surface-emitting laser. A vertical-cavity surface-emitting laser 210 illustrated in FIG. 7 has the same configuration as vertical-cavity surface-emitting laser 10 except that a lower DBR portion 214 is disposed instead of first lower DBR portion 14, cap layer 16, and second lower DBR portion 18. Lower DBR portion 214 includes a ninth layer 214a and a tenth layer 214b that are alternately arranged in a direction along axis Ax. The number of pairs of ninth layer 214a and tenth layer 214b is 33, for example. Ninth layer 214a includes a semiconductor portion 214a1 and an insulator portion 214a2 which surrounds semiconductor portion 214a1. Semiconductor portion 214a1 is, for example, an AlAs layer. Insulator portion 214a2 includes aluminum oxides. Tenth layer 214b is, for example, a GaAs layer.

Above second area 12a2 of main surface 12a of substrate 12, a recessed portion RS1 is disposed instead of recessed portion RS. The bottom of recessed portion RS1 reaches main surface 12a of substrate 12.

FIGS. 8A to 9C are cross-sectional views schematically illustrating steps of a method for manufacturing the vertical-cavity surface-emitting laser illustrated in FIG. 7. Vertical-cavity surface-emitting laser 210 in FIG. 7 may be manufactured as follows.

(Formation of Semiconductor Laminate)

First, as illustrated in FIG. 8A, a semiconductor laminate SL1 is formed on main surface 12a of substrate 12. Specifically, a semiconductor laminate 314 to be lower DBR portion 214, contact layer 28, semiconductor laminate 124 to be third lower DBR portion 24, active layer 20, semiconductor laminate 122 to be upper DBR portion 22, and contact layer 29 are formed in this order on main surface 12a. Semiconductor laminate 314 includes a semiconductor layer 314a and a semiconductor layer 314b that are to be ninth layer 214a and tenth layer 214b, respectively.

(Formation of Trench)

Next, as illustrated in FIG. 8B, trench TR is formed in semiconductor laminate SL1 above second region 12a12 in first area 12a1 of main surface 12a. Thus, post PS surrounded by trench TR is formed.

(Oxidation)

Next, as illustrated in FIG. 8C, post PS is exposed to an oxygen-containing gas such as water vapor to oxidize the outer periphery of post PS. Thus, upper DBR portion 22 and third lower DBR portion 24 are formed.

(Formation of Recessed Portion)

Figure 9A:
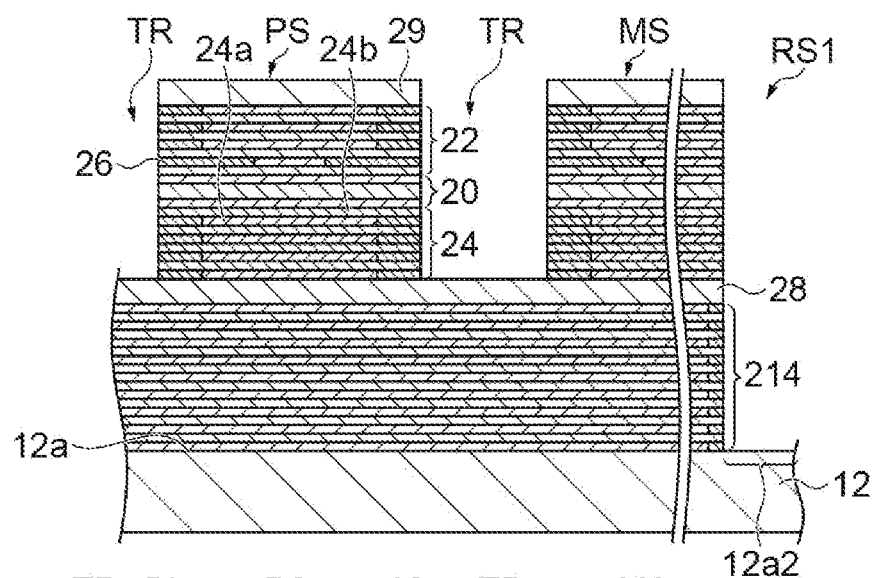
FIGS. 9A to 9C are cross-sectional views schematically illustrating steps of a method for manufacturing the vertical-cavity surface-emitting laser illustrated in FIG. 7.

Next, as illustrated in FIG. 9A, recessed portion RS1 is formed above second area 12a2 of main surface 12a. Thus, mesa MS is formed between recessed portion RS1 and trench TR. Recessed portion RS1 is formed to electrically isolate adjacent elements from each other. After recessed portion RS1 is formed, the side face of semiconductor layer 314a is exposed on the side wall of recessed portion RS1, and naturally oxidized. As a result, ninth layer 214a is formed. Also, tenth layer 214b is formed from semiconductor layer 314b.

(Formation of Insulating Layer)

Figure 9B:
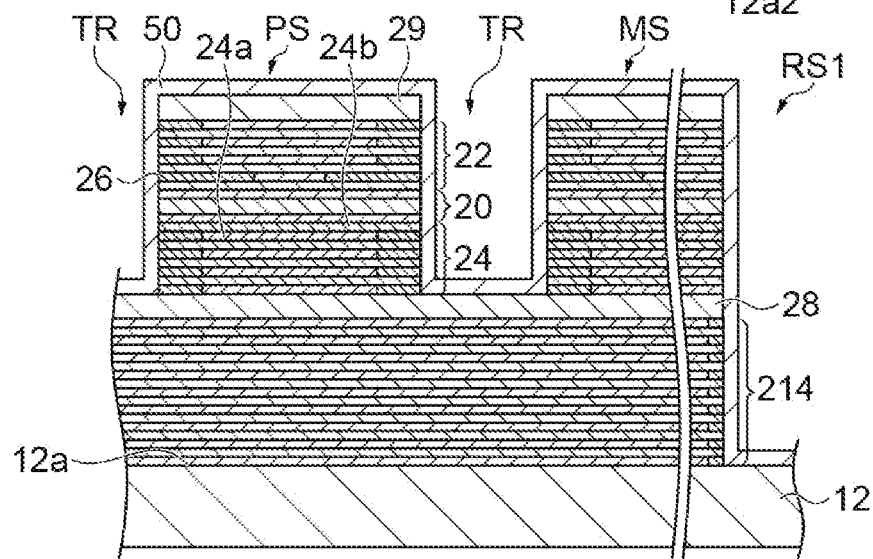

Next, as illustrated in FIG. 9B, insulating layer 50 is formed on post PS, trench TR, mesa MS, and recessed portion RS1.

(Formation of Electrode)

Figure 9C:
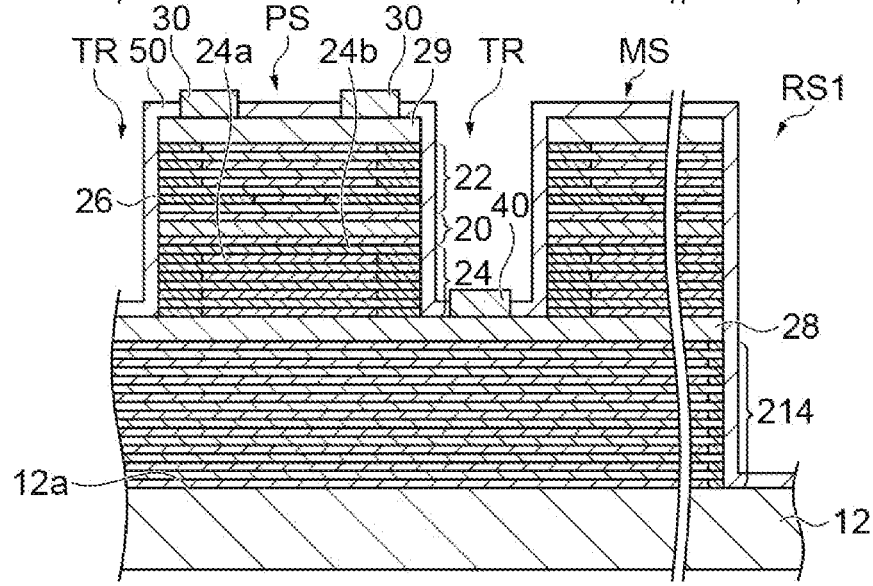

Next, as illustrated in FIG. 9C, first opening 50a and second opening 50b are formed in insulating layer 50. Thereafter, first electrode 30 is formed in first opening 50a, and second electrode 40 is formed in second opening 50b.

(Cutting)

Next, substrate 12 is cut at the bottom of recessed portion RS1. In this way, vertical-cavity surface-emitting laser 210 is manufactured.

Although preferred embodiments of the present disclosure have been described in detail above, the present disclosure is not limited to the above-described embodiments.

For example, vertical-cavity surface-emitting laser 10 may not include contact layer 28. In this case, second electrode 40 is in contact with second lower DBR portion 18.

For example, each of first layer to eighth layer included in the DBR portions may have a graded composition layer in which an Al composition changes toward an adjacent layer. A thickness of the composition-graded layer is, for example, from 10 nm to 30 nm. In the graded composition layer, an Al composition changes linearly so as to approach an Al composition of the adjacent layer.

It should be understood that the embodiments disclosed herein are illustrative and non-restrictive in all respects. The scope of the present invention is defined by the claims, not in the sense described above, and it is intended to embrace all modifications within the meaning and scope of equivalency of the claims.

What is claimed is:

1. A vertical-cavity surface-emitting laser comprising:
a substrate having a main surface including a first area and a second area that surrounds the first area;
a first lower distributed Bragg reflector disposed on the first area and the second area, the first lower distributed Bragg reflector extending to an edge of the main surface;
a III-V compound semiconductor layer disposed on the first lower distributed Bragg reflector;
a second lower distributed Bragg reflector disposed on the III-V compound semiconductor layer;
an active layer disposed above the second lower distributed Bragg reflector; and
an upper distributed Bragg reflector disposed on the active layer, wherein
the III-V compound semiconductor layer is disposed above the first area and the second area,
the second lower distributed Bragg reflector is disposed above the first area,
the first lower distributed Bragg reflector includes a first layer and a second layer that are alternately arranged,
the first layer has a refractive index less than a refractive index of the second layer,
the first layer includes a III-V compound semiconductor including aluminum,
the upper distributed Bragg reflector includes a third layer and a fourth layer that are alternately arranged,
the third layer has a refractive index that is less than a refractive index of the fourth layer,
the third layer includes a III-V compound semiconductor including aluminum,
the III-V compound semiconductor layer is free of aluminum or has an aluminum composition less than an aluminum composition of the third layer,
the first layer has an aluminum composition greater than the aluminum composition of the third layer, and
the III-V compound semiconductor layer has a thickness greater than a thickness of the second layer.

2. The vertical-cavity surface-emitting laser according to claim 1, wherein
the upper distributed Bragg reflector includes a current confinement structure,
the current confinement structure includes a current aperture portion and an insulator portion, the current aperture portion including a III-V compound semiconductor including aluminum,
the insulator portion surrounds the current aperture portion, and
the first layer has an aluminum composition greater than or equal to an aluminum composition of the current aperture portion.

3. The vertical-cavity surface-emitting laser according to claim 1, wherein the second layer is free of aluminum or has an aluminum composition less than the aluminum composition of the III-V compound semiconductor layer.

4. The vertical-cavity surface-emitting laser according to claim 1, wherein the first layer includes AlAs, and the second layer includes GaAs.

5. The vertical-cavity surface-emitting laser according to claim 1, wherein a formula of $T=(m \times \lambda/2 + \lambda/4)/N$ is satisfied, where T is a thickness of the III-V compound semiconductor layer, N is a refractive index of the III-V compound semiconductor layer, $\lambda$ is an oscillation wavelength of the vertical-cavity surface-emitting laser, and m is an integer greater than or equal to 1.

6. The vertical-cavity surface-emitting laser according to claim 1, wherein
the second lower distributed Bragg reflector includes a fifth layer and a sixth layer that are alternately arranged,
the fifth layer has a refractive index less than a refractive index of the sixth layer, and
the number of pairs of the fifth layer and the sixth layer is 8 or more and 25 or less.

7. The vertical-cavity surface-emitting laser according to claim 1, further comprising:
a third lower distributed Bragg reflector disposed between the active layer and the second lower distributed Bragg reflector; and
a contact layer disposed between the second lower distributed Bragg reflector and the third lower distributed Bragg reflector.

8. The vertical-cavity surface-emitting laser according to claim 1, wherein
the III-V compound semiconductor layer is disposed above the first area and the second area, and
the III-V compound semiconductor layer extends to the edge of the main surface in a direction along the main surface.

9. The vertical-cavity surface-emitting laser according to claim 1, wherein
the III-V compound semiconductor layer includes $Al_yGa_{1-y}As$ or GaAs, wherein y is smaller than or equal to 0.3.

10. The vertical-cavity surface-emitting laser according to claim 1, wherein
the upper distributed Bragg reflector is of a first conductivity type, and
the second lower distributed Bragg reflector is of a second conductivity type opposite to the first conductivity type.

11. The vertical-cavity surface-emitting laser according to claim 1, wherein
the substrate is a semi-insulating substrate.

12. The vertical-cavity surface-emitting laser according to claim 10, wherein
the first lower distributed Bragg reflector is undoped or is of the first conductivity type.

13. The vertical-cavity surface-emitting laser according to claim 10, wherein
the III-V compound semiconductor layer is undoped or is of the second conductivity type.

14. The vertical-cavity surface-emitting laser according to claim 1, wherein
the second lower distributed Bragg reflector has a dopant concentration higher than a dopant concentration of the III-V compound semiconductor layer.

* * * * *